United States Patent
Baik et al.

(10) Patent No.: US 8,852,406 B2
(45) Date of Patent: Oct. 7, 2014

(54) METHOD FOR SYNTHESIS OF CUBIC BORON NITRIDE

(71) Applicant: Korea Institute of Science and Technology, Seoul (KR)

(72) Inventors: Young Joon Baik, Seoul (KR); Jong Keuk Park, Seoul (KR); Wook Seong Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 13/744,557

(22) Filed: Jan. 18, 2013

(65) Prior Publication Data

US 2013/0295387 A1 Nov. 7, 2013

(30) Foreign Application Priority Data

May 3, 2012 (KR) .................. 10-2012-0046828

(51) Int. Cl.
*C23C 14/34* (2006.01)
*C23C 14/46* (2006.01)
*C23C 16/34* (2006.01)
*C23C 14/06* (2006.01)

(52) U.S. Cl.
CPC .............. *C23C 16/342* (2013.01); *C23C 14/46* (2013.01); *C23C 14/06* (2013.01); *C23C 14/34* (2013.01)
USPC .............. 204/192.1; 204/192.11; 427/255.38; 427/255.394

(58) Field of Classification Search
USPC ................ 427/255.394, 595, 597, 255.38; 204/192.1, 192, 11
See application file for complete search history.

(56) References Cited

U.S. PATENT DOCUMENTS

| 4,816,291 | A | 3/1989 | Desphandey et al. | |
|---|---|---|---|---|
| 5,928,771 | A | 7/1999 | DeWald, Jr. et al. | |
| 6,086,959 | A | 7/2000 | Inspektor | |
| 6,544,599 | B1 | 4/2003 | Brown et al. | |
| 7,645,513 | B2 | 1/2010 | Bello et al. | |
| 8,007,910 | B2 * | 8/2011 | Zhang et al. | 428/408 |
| 2006/0147282 | A1 * | 7/2006 | Bello et al. | 407/119 |
| 2008/0303378 | A1 * | 12/2008 | Lee et al. | 310/313 A |
| 2009/0022969 | A1 * | 1/2009 | Zhang et al. | 428/216 |
| 2010/0093171 | A1 * | 4/2010 | Zhang et al. | 438/689 |

FOREIGN PATENT DOCUMENTS

| JP | 03-211268 A | 9/1991 |
|---|---|---|
| JP | 06-207274 A | 7/1994 |
| KR | 1989-0003982 A | 4/1989 |
| KR | 100991770 B1 | 10/2010 |
| KR | 1020100138672 A | 12/2010 |

OTHER PUBLICATIONS

Yoshida, Toyonobu, et al., "Vapour phase deposition of cubic boron nitride". Diamond and Related Materials 5 (1996) 501-507.*
Zhu, P.W., et al., "Prepared Low Stress Cubic Boron Nitride Film by Physical Vapor Deposition". Journal of Solid State Chemistry 167, 420-424 (2002).*
Rossi, F, et al., "Plasma assisted chemical vapour deposition of boron nitride coatings from using BCl3-N2-H2-Ar gas mixture." Vacuum 52 (1999) 169-181.*
Zhang, W.J., et al., "Thick and adherent cubic boron nitride films grown on diamond interlayers by fluorine-assisted chemical vapor deposition". Applied Physics Letters, vol. 85, No. 8, Aug. 23, 2004, 1344-1346.*
H.S.Kim, et al; "Variation of residual stress in cubic boron nitride film caused by hydrogen addition during unbalanced magnetron sputtering", Thin Solid Films, vol. 519: Issue 2, Sep. 1, 2011; available online Jul. 2, 2011.
J.B. Wang, et al; "Cubin-BN nanocrystals synthesis by pulsed laser induced liquid-solid interfacial reaction", Chemical Physics Letters, vol. 367, Issues 1-2, EX1-EX2, pp. 10-14, Jan. 2, 2003.
Qi He, et al; "Deposition of c-BN on silicon substrates coated with diamond thin films", Thin Solid Films, vol. 474, Issues 1-2, pp. 96-102, Mar. 1, 2005; available online Sep. 13, 2004.
Eun-Ok Lee, et al; "Effect of Microstructure of hBN Thin Films on the Nucleation of cBN Phase Deposited by RF UBM Sputtering System", Journal of the Korean Vacuum Society, vol. 13, No. 4, pp. 150-156, Received Aug. 23, 2004.
Wilhelm Kulisch, et al; "Parameter spaces for the nucleation and the subsequent growth of cubic boron nitride films", Thin Solid Films, vol. 423, Issue 2, pp. 183-195, Jan. 15, 2003.
Y.M. Chong, et al; "Tribological study of boron nitride films", Diamond & Related Materials, vol. 19, Issues 5-6, pp. 654-660, May-Jun. 2010; available online Feb. 22, 2010.

* cited by examiner

*Primary Examiner* — Bret Chen
(74) *Attorney, Agent, or Firm* — Ladas & Parry LLP

(57) ABSTRACT

A method for producing a cubic boron nitride (cBN) thin film includes depositing cBN onto nanocrystalline diamond having controlled surface irregularity characteristics to improve the adhesion at the interface of cBN/nanocrystalline diamond, while incorporating hydrogen to a reaction gas upon the synthesis of cBN and controlling the feed time of hydrogen, so that harmful reactions occurring on a surface of nanocrystalline diamond and residual stress applied to cBN may be inhibited. Also, a cBN thin film structure is obtained by the method. The cBN thin film is formed on the nanocrystalline diamond thin film by using a physical vapor deposition process, wherein a reaction gas supplied when the deposition of a thin film occurs is a mixed gas of argon (Ar) with nitrogen ($N_2$), and hydrogen ($H_2$) is added to the reaction gas at a time after the deposition of a thin film occurs.

2 Claims, 4 Drawing Sheets

METHOD FOR SYNTHESIS OF CUBIC BORON NITRIDE

CROSS-REFERENCE TO RELATED APPLICATION

This application claims priority to Korean Patent Application No. 10-2012-0046828, filed on May 3, 2012, and all the benefits accruing therefrom under 35 U.S.C. §119, the contents of which in its entirety are herein incorporated by reference.

BACKGROUND

1. Field

Embodiments relate to a method for producing a cubic boron nitride (cBN) thin film and a cBN thin film structure. More particularly, the embodiments relate to a method for producing a cBN thin film, including depositing cBN onto nanocrystalline diamond having controlled surface irregularity characteristics to improve the adhesion at the interface of cBN/nanocrystalline diamond, while incorporating hydrogen to a reaction gas upon the synthesis of cBN and controlling the feed time of hydrogen, so that harmful reactions occurring on a surface of nanocrystalline diamond and residual stress applied to cBN may be inhibited. The embodiments also relates to a cBN thin film structure obtained by the method.

2. Description of the Related Art

Cubic boron nitride (cBN) has physical properties similar to those of diamond which has the highest hardness and heat conductivity. In addition to this, cBN has higher oxidation resistance, high-temperature stability and reaction stability against iron-based metals as compared to diamond. Therefore, cBN is a material having high industrial applicability as a wear-resistant thin film for cutting tools, molds, or the like. Such a cBN thin film may be deposited by various processes including chemical vapor deposition or vacuum physical vapor deposition. However, the cBN thin film deposited by such processes is problematic in terms of its adhesion, and thus cannot be applied in practice. Weak adhesion of a cBN thin film results from the presence of an amorphous BN thin film layer and turbostratic BN (tBN) thin film layer formed at the initial stage of cBN thin film formation and high residual compression stress of the thin film. To solve such problems, attempts have been made to reduce the residual stress of the thin film or to enhance the adhesion by the insertion of an artificial intermediate layer.

Meanwhile, diamond has a lattice parameter similar to that of cBN, and thus may grow cBN on diamond at a high temperature of 900° C. or more. Based on this, there has been suggested a so-called heteroepitaxial film of cBN/diamond film that ensures excellent adhesion to diamond by allowing growth of a cBN thin film without formation of any weak intermediate layer such as tBN (U.S. Pat. No. 7,645,513). In the cBN/diamond composite film suggested from the U.S. Pat. No. 7,645,513, the diamond film corresponds to a microcrystalline diamond film synthesized through a chemical vapor deposition process. Such a diamond thin film has the following typical characteristics. First, the diamond thin film includes micrometer-sized diamond particles and, as shown in FIG. 1, has a distinct particle growth surface, thereby representing surface irregularities. Such surface irregularities adversely affect cBN deposition due to the reasons described hereinafter. Next, residual stress is applied to diamond itself. It is known that a diamond thin film has a residual stress of several GPas applied thereto. It is also well known that such residual stress causes a drop in adhesion between diamond and a matrix.

Now, the reasons why the surface irregularities of a diamond thin film adversely affect cBN synthesis will be described. The synthesis of a cBN thin film is accomplished by an ion beam deposition or sputtering process. An ion beam deposition process requires independent ion collisions having a predetermined level of energy and flux. A sputtering process requires ion collisions having a predetermined level of energy and flux from plasma (W. Kulisch and S. Ulrich, "Parameter spaces for the nucleation and the subsequent growth of cubic boron nitride", Thin Solid Films 423 (2003) 183-195). In addition, during the synthesis of cBN, the cBN content of the resultant film, deposition rate, etc., significantly depend on the energy of ions. During a sputtering process, it is possible to control the energy of ions by modifying negative voltage applied to a substrate. Particularly, sputtering processes are used widely in various industrial fields, and uniform ion energy has to be ensured to perform stable and uniform deposition of cBN. Meanwhile, actual energy of ions is determined not by the average voltage applied to a substrate but by a local electric field, and electric field characteristics depend on surface shapes. In the case of a sharp surface, electric field is concentrated, resulting in an increase in ion energy. In addition, it is highly likely that ion flux depending on electric field distribution also increases. Therefore, when a surface has irregularities like a micrometer-sized diamond thin film, cBN deposition may be affected locally by the surface irregularities. Due to the above reasons, applications using a micrometer-sized diamond thin film as an intermediate layer for cBN deposition have several problems.

Meanwhile, there has been suggested a method for adding hydrogen to a reaction gas to reduce the residual stress (H.-S. Kim, J.-K. Park, W.-S. Lee and Y.-J. Baik, "Variation of residual stress in cubic boron nitride film caused by hydrogen addition during unbalanced magnetron sputtering", Thin Solid Films 519 (2011) 7871-7874). It is highly likely that the method reduces the residual stress very simply to ensure adhesion. In addition, it is expected that combination of the method with an intermediate layer such as diamond provides adhesion enhancement as well as residual stress reduction, and thus is very useful in practice. However, hydrogen may be adsorbed easily to diamond. Thus, when hydrogen is added during the synthesis of cBN, it may react with a diamond surface so that the diamond/cBN adhesion is lower than originally expected, resulting in interruption of the growth of a cBN/diamond thin film.

SUMMARY

An aspect of the present disclosure is directed to providing a method for producing a cubic boron nitride (cBN) thin film, including depositing cBN onto nanocrystalline diamond having controlled surface irregularity characteristics to improve the adhesion at the interface of cBN/nanocrystalline diamond, while incorporating hydrogen to a reaction gas upon the synthesis of cBN and controlling the feed time of hydrogen, so that harmful reactions occurring on a surface of nanocrystalline diamond and residual stress applied to cBN may be inhibited. Another aspect of the present disclosure is directed to providing a cBN thin film structure obtained by the method.

According to an embodiment, a method for producing a cBN thin film includes forming a cBN thin film on a nanocrystalline diamond thin film by using a physical vapor deposition process. During the physical vapor deposition process, a reaction gas supplied when the deposition of a thin film occurs is a mixed gas of argon (Ar) with nitrogen ($N_2$), and hydrogen ($H_2$) may be added to the reaction gas at a time after the deposition of a thin film occurs.

Before the cBN thin film is formed on the nanocrystalline diamond thin film, a turbostratic BN (tBN) thin film is formed. A mixed gas of Ar with $N_2$ is supplied as a reaction gas until the time of the tBN thin film formation, and a mixed gas of Ar, $N_2$ and $H_2$ is supplied as a reaction gas after the completion of the growth of the tBN thin film.

The physical vapor deposition process may be a sputtering process or ion beam deposition process.

According to an embodiment, a cBN thin film structure includes a tBN thin film and a cBN thin film grown sequentially on a nanocrystalline diamond thin film. The tBN thin film and the cBN thin film may be formed through a sputtering process or ion beam deposition process. A mixed gas of Ar with $N_2$ is used as a reaction gas during the growth of the tBN thin film, while a mixed gas of Ar, $N_2$ and $H_2$ is used as a reaction gas after the completion of the growth of the tBN thin film.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Exemplary embodiments now will be described more fully hereinafter with reference to the accompanying drawings, in which exemplary embodiments are shown.

Figure 1:
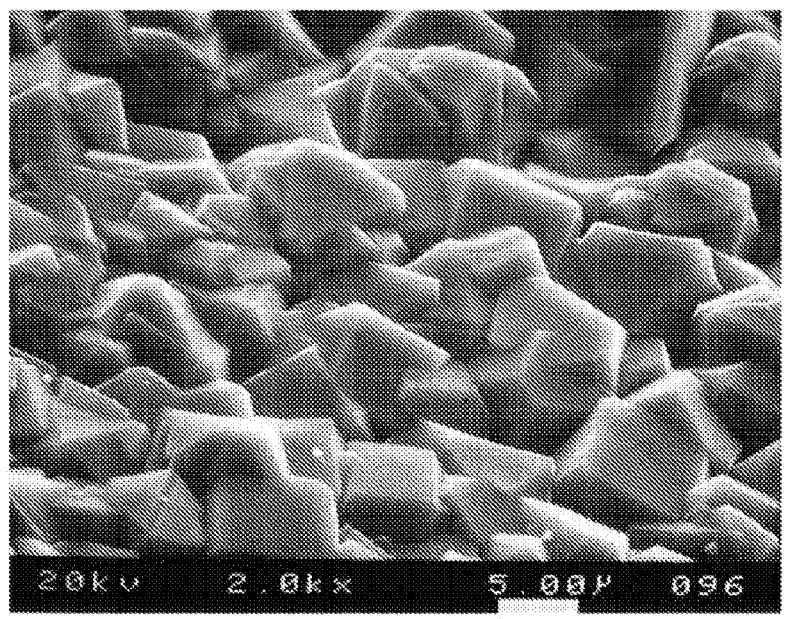
FIG. 1 is a scanning electron microscopy (SEM) image of the surface of a diamond thin film having micro-sized particles.
Figure 2:
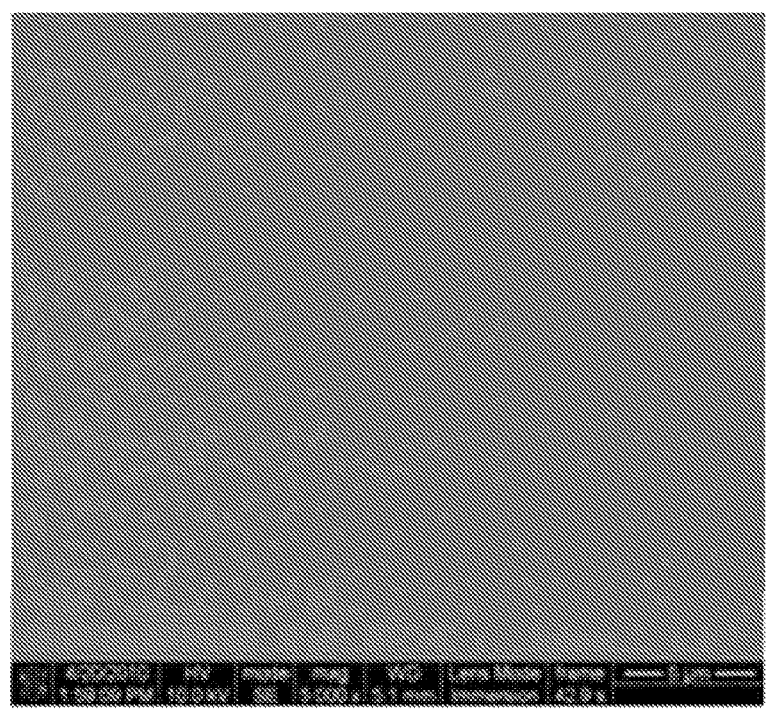
FIG. 2 is an SEM image showing a smooth surface morphology of a nanocrystalline diamond thin film.

According to an embodiment, a heteroepitaxial film including a cubic boron nitride (cBN) thin film formed on a nanocrystalline diamond thin film is provided. To improve the adhesion of cBN/diamond thin film, the following two conditions are applied. First, a nanocrystalline diamond (NCD) thin film is used as a diamond thin film to solve the problem of non-uniform electric fields caused by surface irregularities of a diamond thin film. As used herein, the term 'nanocrystalline diamond thin film' means a thin film of particles having a size of several nanometers and a surface roughness of several nanometers. As shown in FIG. 2, a nanocrystalline diamond thin film has a very smooth structure. As described in the section of 'BACKGROUND" hereinbefore, when a diamond thin film has significant surface irregularities (i.e., high surface roughness), electric fields applied to the overall surface of a substrate during sputtering are not uniform, and thus the ion energy and ion flux applied to the substrate are different from one portion to another portion, resulting in non-uniformity in synthesis behavior of a cBN thin film formed on a diamond thin film. According to embodiments of the present disclosure, a nanocrystalline diamond thin film having highly controlled surface irregularities (i.e., having a very small surface roughness) is used to solve a decrease in cBN adhesion caused by surface irregularities.

According to the present disclosure, the second condition applied herein to improve the adhesion of cBN/nanocrystalline diamond thin film is selective feed of hydrogen during the growth of a cBN thin film. According to an embodiment, cBN is grown through a physical vapor deposition process, particularly through a sputtering process or an ion beam deposition process. Such a sputtering process or ion beam deposition process includes exciting a reaction gas to perform ionization, and allowing the ions to collide with a target material (BN) to form cBN. Incorporation of hydrogen to a reaction gas during the sputtering or ion beam deposition process may minimize residual stress applied to cBN. However, hydrogen causes degradation of interfacial characteristics between cBN and the nanocrystalline diamond thin film, resulting in degradation of adhesion. According to an embodiment, such residual stress is reduced by adding hydrogen, while hydrogen feed times are controlled to prevent degradation of interfacial characteristics between cBN and the nanocrystalline diamond thin film. Although it has been described hereinbefore in the section of 'BACKGROUND' that production of turbostratic BN (tBN) may be inhibited when forming cBN on a diamond thin film (U.S. Pat. No. 7,645,513), it is not possible to avoid production of tBN during the growth of cBN in practice, unless the deposition temperature is around 1000° C. Further, it has been determined experimentally that degradation of interfacial characteristics of cBN/diamond thin film upon supplying hydrogen results from degradation of interfacial characteristics of tBN/nanocrystalline diamond thin film caused by a reaction of hydrogen with the surface of a nanocrystalline diamond thin film during the growth of tBN formed at the initial stage of a cBN deposition process. Under these circumstances, according to an embodiment, hydrogen is supplied after the tBN growth is completed (i.e., after the tBN thin film is deposited completely on the overall surface of nanocrystalline diamond). In this manner, it is possible to prevent degradation of interfacial characteristics of tBN/diamond thin film while minimizing residual stress applied to cBN. The tBN has a hexagonal structure, which distinguishes tBN from cBN having a cubic structure. Thus, it is possible in practice to supply hydrogen selectively at the time after the hexagonal tBN is grown completely on the overall surface of a nanocrystalline diamond thin film.

The nanocrystalline diamond (NCD) thin film used herein may be formed on a silicon substrate through microwave plasma assisted chemical vapor deposition (MW-PACVD) or hot filament CVD (HFCVD). In addition, the reaction gas in the sputtering process or ion beam deposition process for the synthesis of cBN is a mixed gas of argon (Ar), nitrogen ($N_2$) and hydrogen ($H_2$). Particularly, a mixed gas of Ar with $N_2$ is supplied until the growth of tBN is completed, while a mixed gas of Ar, $N_2$ and $H_2$ is supplied after the completion of the growth of tBN.

Hereinafter, some examples of the method for producing cBN will now be described together with characterization of the resultant cBN.

EXAMPLE 1

Synthesis of cBN Using Si Substrate and Ar—$N_2$ Mixed Gas

A cBN thin film is deposited on a silicon (Si) substrate by using an unbalanced magnetron (UBM) sputtering process. A hexagonal BN target having a diameter of about 5 cm is used and is connected to a 400 W high-frequency power source with 13.56 MHz. The silicon substrate is positioned on a molybdenum (Mo) support having a diameter of about 10 cm. To apply a negative bias to the substrate, a high-frequency power source with 200 KMz is connected to the substrate support and an electric voltage of −40V is applied thereto. A reaction chamber is evacuated to reach a pressure of $10^{-6}$ mtorr or less, a mixed Ar—$N_2$ gas containing 10 vol % of nitrogen is supplied into the chamber so that the chamber maintains a pressure of 2 mtorr. The silicon substrate is washed with a general organic solvent and placed in the chamber. Deposition is carried out for 20 minutes, and the thin film grown on the silicon substrate has a thickness of about 100 nm.

After the grown thin film is analyzed by Fourier Transformed Infrared (FTIR), it is shown that the thin film contains about 80% or more of cBN phase. The silicon substrate having the grown thin film thereon is taken out of the reaction chamber. It is observed that the thin film is separated from the substrate within several minutes after the substrate is taken out of the reaction chamber. In addition, after measuring residual stress of the thin film in a real-time mode during the deposition, it is determined that a residual stress of about 11 Gpa is applied.

EXAMPLE 2

Synthesis of Nanocrystalline Diamond (NCD) Thin Film

Diamond is synthesized on a silicon substrate by using a hot filament CVD (HFCVD) process. The substrate is mounted on a water-cooled block, and a tungsten filament is provided at a position spaced by 1 cm from and above the substrate. The tungsten filament is heated by a resistance heater to a temperature of 2100° C., and a mixed gas containing hydrogen ($H_2$) mixed with 1 vol % of methane ($CH_4$) is used as a precursor. While the pressure in the chamber is maintained at 7.5 torr, a nanocrystalline diamond thin film with a thickness of 1 μm is grown on the substrate heated to about 700° C. The grown nanocrystalline thin film is very smooth as shown in FIG. 2. After analyzing the nanocrystalline thin film by atomic force microscopy (AFM), it is determined that the thin film has a surface roughness of about 5 nm.

EXAMPLE 3

Synthesis of cBN Using NCD Thin Film and Ar—$N_2$ Mixed Gas

The process condition as described in Example 1 is applied to the nanocrystalline diamond thin film obtained from Example 2 to produce cBN. After analyzing the deposited cBN thin film, it is shown that the cBN thin film has an FTIR spectrum, thin film thickness and residual stress, substantially the same as those of the cBN thin film grown through Example 1. However, there is a significant difference between both films in terms of the time when the cBN thin film is separated from the substrate. While the thin film of Example 1 is separated within several minutes, the cBN thin film of Example 3 is separated after the lapse of several weeks.

After electron microscopy is performed to determine whether heteroepitaxial crystals are grown or not, it is shown that there is no evidence for the growth of heteroepitaxial crystals, and a tBN thin film layer exists between a cBN thin film and a nanocrystalline diamond thin film. The fact that separation of a cBN thin film is delayed even though heteroepitaxial crystals are not grown suggests that the nanocrystalline diamond thin film contributes to stabilization of tBN. As can be seen from the above results, it is expected that optimization of deposition conditions allows synthesis of a cBN thin film having improved adhesion.

EXAMPLE 4

Synthesis of cBN Using NCD Thin Film and Ar—$N_2$-$H_2$ Mixed Gas

Figure 3:
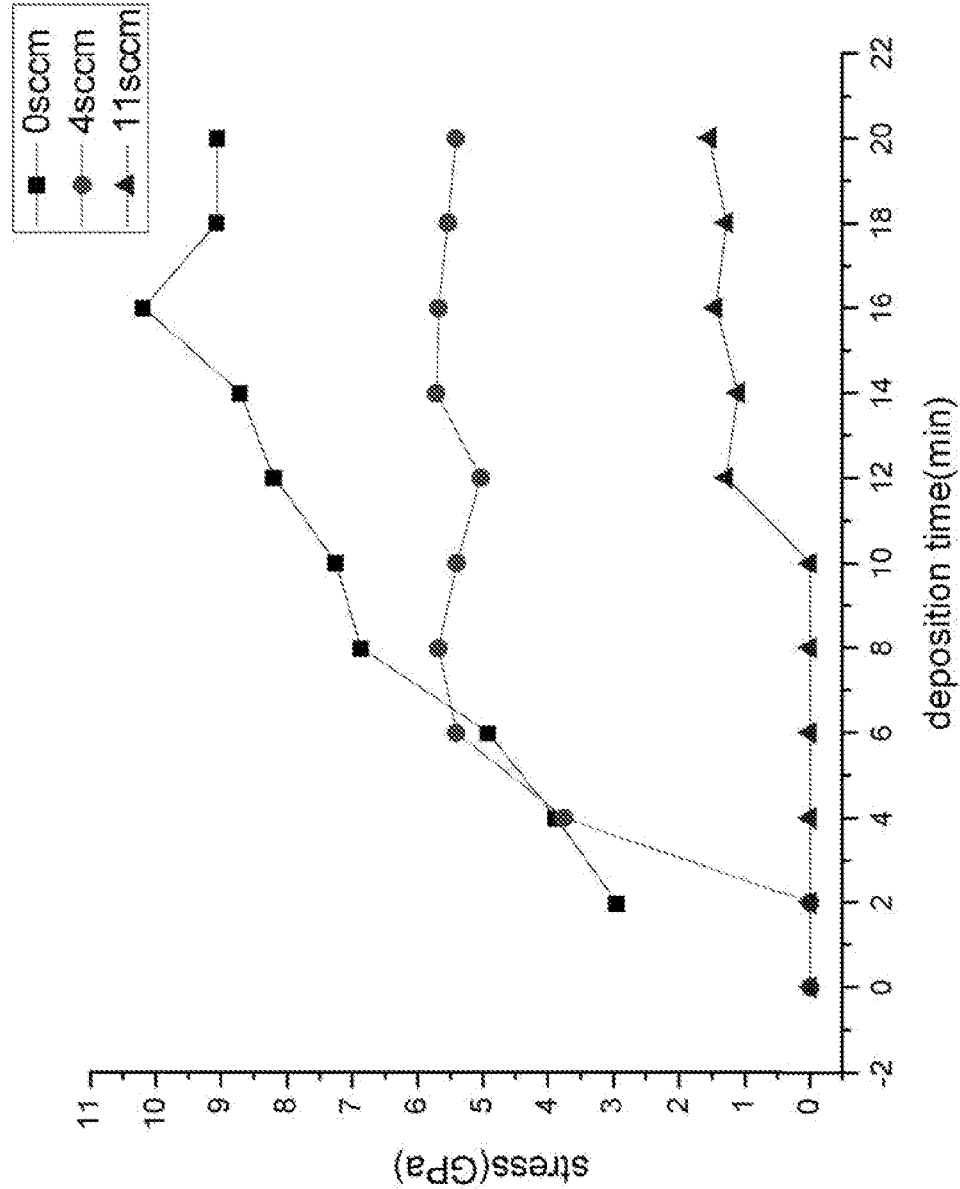
FIG. 3 is a graph showing a change in residual stress of a cBN thin film as a function of hydrogen addition.

A cBN thin film is synthesized on a nanocrystalline diamond thin film by using, as a reaction gas, a mixed gas of Ar—$N_2$—$H_2$ instead of a mixed gas of Ar—$N_2$, according to the process conditions as described in Example 3. While the flow rate of the total reaction gas is set to 20 sccm, the flow rate of $H_2$ is increased to 0-11 sccm. FIG. 3 is a graph showing a change in residual stress of a cBN thin film as a function of hydrogen addition. It can be seen that as hydrogen addition increases, residual stress decreases. However, it is observed that the deposited cBN thin film is separated just as soon as the thin film is exposed to the air. The fact that separation of a cBN thin film occurs rapidly despite a significant decrease in residual stress caused by hydrogen addition means that the interfacial layer between the nanocrystalline diamond thin film and the cBN thin film is weakened significantly, possibly due to hydrogen addition. Therefore, a solution for the above problem is required.

EXAMPLE 5

Synthesis of cBN Through Control of $H_2$ Feed Points

To solve the problem described in Example 4, a cBN thin film is synthesized by controlling hydrogen feed points. Particularly, hydrogen is supplied additionally, 2 minutes, 4 minutes and 6 minutes after the deposition occurs, respectively. Before supplying hydrogen, a mixed gas of Ar—$N_2$ is supplied alone as a reaction gas. The other processing conditions are the same as Example 4. As the hydrogen feed point is delayed, separation of the cBN thin film is reduced significantly. When the hydrogen feed points are 2 minutes and 4 minutes after the deposition begins, the film separation starts at the second day and the fifth day, respectively. When the hydrogen feed point is 6 minutes after the deposition occurs, no film separation is observed even after 1 week. After observing the growth rate of the cBN thin film and carrying out electron microscopy, it is shown that a tBN thin film is grown until approximately 6 minutes after the deposition occurs, and then a cBN thin film is grown. Such results suggest that limited supply of hydrogen during the growth of a tBN thin film improves the interfacial characteristics between the grown thin film and the nanocrystalline thin film, while improving the residual stress characteristics of the grown cBN thin film.

Figure 4A:
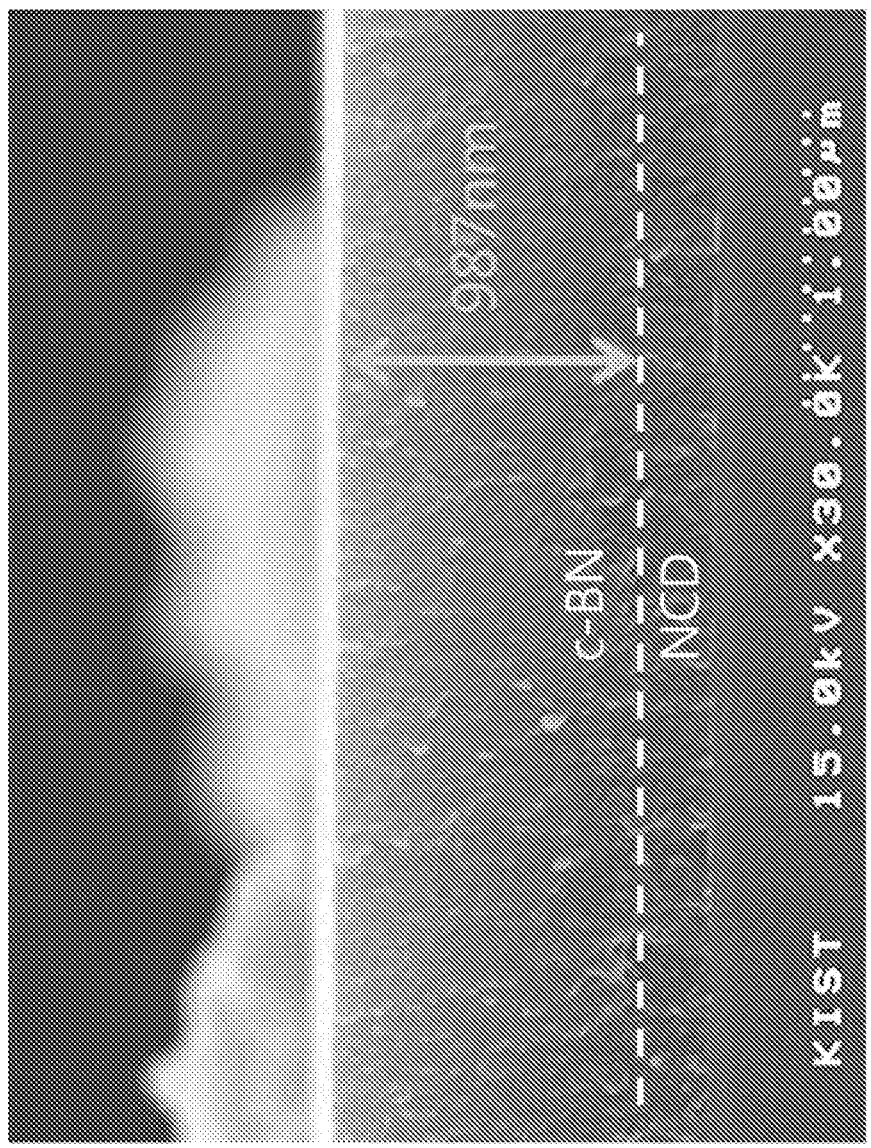
FIG. 4a and FIG. 4b are SEM images showing a cross-section of a cBN thin film deposited on a nanocrystalline thin film.
Figure 4B:
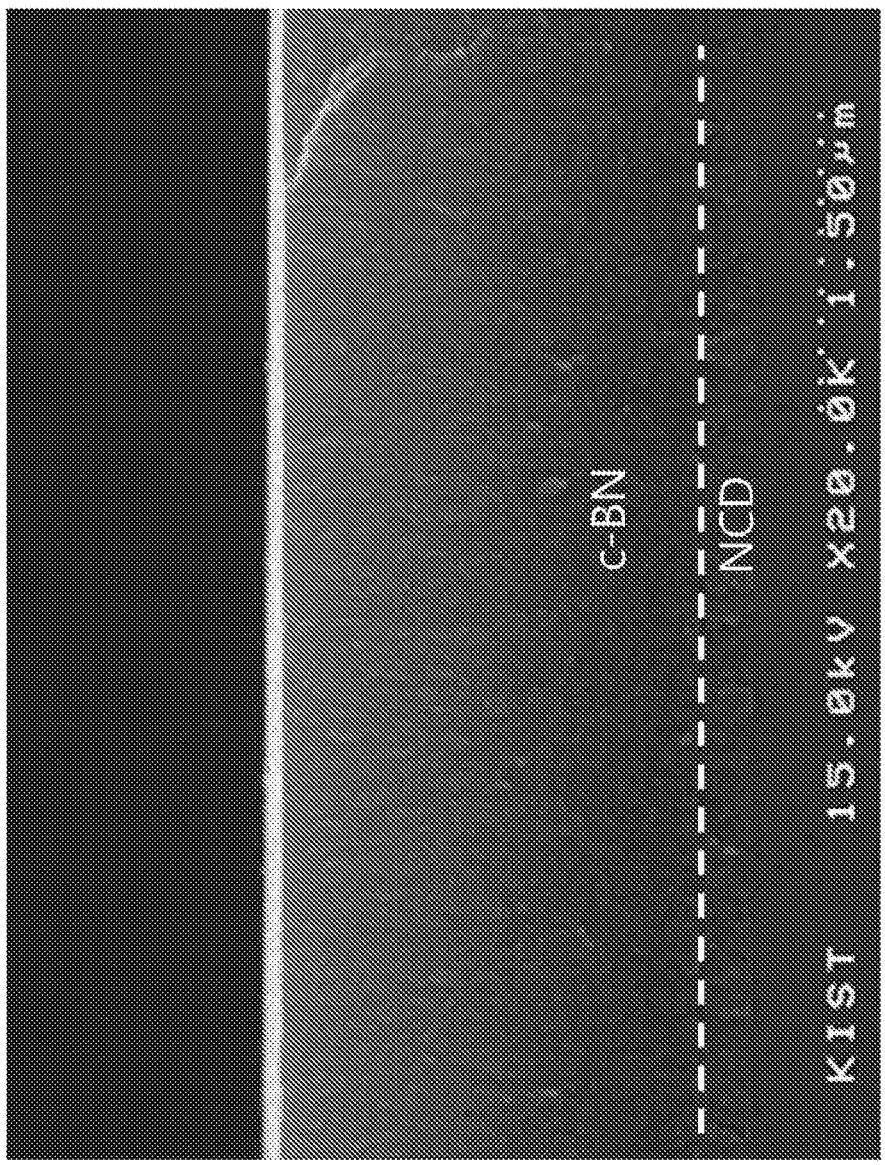

Further, cBN films are grown to a thickness of 1 μm and 2 μm by using the conditions of: a hydrogen feed point of 6 minutes after the deposition occurs, a flow rate of the Ar—$N_2$—$H_2$ mixed gas of 20 sccm with a hydrogen flow rate of 7 sccm, a bias of −40V, and the deposition time of 3 hours and 6 hours. As can be seen from FIG. 4a and FIG. 4b illustrating SEM images of cBN thin films grown for 3 hours and 6 hours, respectively, each cBN thin film is adhered well to the nanocrystalline diamond thin film.

The method for producing a cBN thin film and a cBN thin film obtained thereby according to the embodiments provide the following effects.

It is possible to improve the adhesion between a diamond thin film and cBN by depositing cBN on nanocrystalline diamond. It is also possible to improve the interfacial characteristics between cBN and the diamond thin film by controlling the feed time of hydrogen during the synthesis of a cBN thin film.

While the exemplary embodiments have been shown and described, it will be understood by those skilled in the art that various changes in form and details may be made thereto without departing from the spirit and scope of the present disclosure as defined by the appended claims.

What is claimed is:

1. A method for producing a cubic boron nitride (cBN) thin film on a nanocrystalline diamond thin film using a sputtering process or ion beam deposition process, the method comprising:

exciting a reaction gas to perform ionization of the reaction gas; and forming the cBN thin film on the nanocrystalline diamond thin film by allowing ions created from the reaction gas to collide with a target material, wherein, in the forming the cBN thin film, the reaction gas supplied when the deposition of a thin film occurs is a mixed gas of argon (Ar) with nitrogen ($N_2$), and hydrogen ($H_2$) is added to the reaction gas at a time after the deposition of a thin film occurs.

2. The method according to claim 1, wherein a turbostratic BN (tBN) thin film is formed before the cBN thin film is formed on the nanocrystalline diamond thin film, wherein a mixed gas of Ar with $N_2$ is supplied as a reaction gas until the time of the tBN thin film formation, and wherein a mixed gas of Ar, $N_2$ and $H_2$ is supplied as a reaction gas after the completion of the growth of the tBN thin film.

* * * * *